(12) United States Patent
Arfsten et al.

(10) Patent No.: US 10,099,193 B2
(45) Date of Patent: Oct. 16, 2018

(54) HYBRID ORGANIC-INORGANIC NANO-PARTICLES

(71) Applicant: DSM IP ASSETS B.V., Heerlen (NL)

(72) Inventors: Nanning Joerg Arfsten, Echt (NL); Roberto Arnoldus Dominicus Maria Habets, Echt (NL); Michael Alphonsus Cornelis Johannes Van Dijck, Echt (NL)

(73) Assignee: DSM IP ASSETS B.V., Heerlen (NL)

( * ) Notice: Subject to any disclaimer, the term of this patent is extended or adjusted under 35 U.S.C. 154(b) by 64 days.

(21) Appl. No.: 14/402,869

(22) PCT Filed: May 17, 2013

(86) PCT No.: PCT/EP2013/060274
§ 371 (c)(1),
(2) Date: Nov. 21, 2014

(87) PCT Pub. No.: WO2013/174753
PCT Pub. Date: Nov. 28, 2013

(65) Prior Publication Data
US 2015/0132479 A1 May 14, 2015

(30) Foreign Application Priority Data

May 22, 2012 (EP) ..................................... 12168870
May 22, 2012 (EP) ..................................... 12168873

(51) Int. Cl.
*B01J 13/00* (2006.01)
*B01J 13/12* (2006.01)
(Continued)

(52) U.S. Cl.
CPC ............. *B01J 13/125* (2013.01); *B01J 13/18* (2013.01); *B05D 3/0254* (2013.01); *B05D 5/061* (2013.01);
(Continued)

(58) Field of Classification Search
CPC ................................. B01J 13/18; B01J 13/125
See application file for complete search history.

(56) References Cited

U.S. PATENT DOCUMENTS 4,749,762 A * 6/1988 Foss .......................... C08F 8/12
525/328.2
9,550,161 B2 1/2017 Arfsten et al.
(Continued)

FOREIGN PATENT DOCUMENTS

WO    WO 01/80823    11/2001
WO    WO 2005/103175    11/2005
(Continued)

OTHER PUBLICATIONS

International Search Report for PCT/EP2013/060274 dated Jul. 29, 2013.
(Continued)

*Primary Examiner* — Robert A Vetere
(74) *Attorney, Agent, or Firm* — Nixon & Vanderhye P.C.

(57) ABSTRACT

The invention relates to a method of making hybrid organic-inorganic core-shell nano-particles, comprising the steps of a) providing colloidal organic particles comprising a synthetic polyampholyte as a template; b) adding at least one inorganic oxide precursor; and c) forming a shell layer from the precursor on the template to result in core-shell nano-particles. With this method it is possible to make colloidal organic template particles having an average particle size in the range of 10 to 300 nm; which size can be controlled by the comonomer composition of the polyampholyte, and/or by selecting dispersion conditions. The invention also relates to organic-inorganic or hollow-inorganic core-shell nano-particles obtained with this method, to compositions comprising such nano-particles, to different uses of said nano-particles and compositions, and to products compris-
(Continued)

ing or made from said nano-particles and compositions, including anti-reflective coatings and composite materials.

12 Claims, 3 Drawing Sheets

(51) Int. Cl.
| | |
|---|---|
| B01J 13/18 | (2006.01) |
| C03C 17/00 | (2006.01) |
| G02B 1/11 | (2015.01) |
| H01L 31/0216 | (2014.01) |
| H01L 31/0232 | (2014.01) |
| H01L 31/0236 | (2006.01) |
| C01G 23/047 | (2006.01) |
| C01G 25/02 | (2006.01) |
| C08J 3/12 | (2006.01) |
| C09D 5/00 | (2006.01) |
| C01B 33/143 | (2006.01) |
| C01B 33/145 | (2006.01) |
| C01B 33/149 | (2006.01) |
| G02B 1/111 | (2015.01) |
| B05D 3/02 | (2006.01) |
| B05D 5/06 | (2006.01) |
| C09D 7/40 | (2018.01) |

(52) U.S. Cl.
CPC .......... *C01B 33/143* (2013.01); *C01B 33/145* (2013.01); *C01B 33/149* (2013.01); *C01G 23/047* (2013.01); *C01G 25/02* (2013.01); *C03C 17/007* (2013.01); *C08J 3/128* (2013.01); *C09D 5/006* (2013.01); *C09D 7/67* (2018.01); *C09D 7/70* (2018.01); *G02B 1/11* (2013.01); *G02B 1/111* (2013.01); *H01L 31/02168* (2013.01); *H01L 31/02325* (2013.01); *H01L 31/02366* (2013.01); *C01P 2004/34* (2013.01); *C01P 2004/64* (2013.01); *C03C 2217/425* (2013.01); *C03C 2217/732* (2013.01); *Y02E 10/50* (2013.01); *Y10T 428/24997* (2015.04)

(56) References Cited

U.S. PATENT DOCUMENTS

| | | | |
|---|---|---|---|
| 2002/0064541 A1* | 5/2002 | Lapidot | A61K 8/042 424/401 |
| 2003/0068363 A1* | 4/2003 | Clark | A61K 39/0008 424/450 |
| 2003/0157248 A1* | 8/2003 | Watkins | B01D 67/003 427/256 |
| 2005/0037496 A1* | 2/2005 | Rozema | A61K 47/48176 435/455 |
| 2007/0016985 A1* | 1/2007 | Miller | C12N 15/8207 800/295 |
| 2007/0106061 A1* | 5/2007 | Zollinger | C08F 6/003 528/480 |
| 2009/0220774 A1 | 9/2009 | Imai et al. | |
| 2010/0009001 A1* | 1/2010 | Armes | C08K 3/36 424/490 |
| 2011/0250626 A1 | 10/2011 | Williams | |
| 2013/0202895 A1 | 8/2013 | Arfsten et al. | |
| 2013/0330386 A1 | 12/2013 | Whitten et al. | |

FOREIGN PATENT DOCUMENTS

| | | |
|---|---|---|
| WO | WO 2008/028640 | 3/2008 |
| WO | WO 2008/143429 | 11/2008 |
| WO | WO 2009/140482 | 11/2009 |
| WO | WO 2011/157820 | 12/2011 |

OTHER PUBLICATIONS

WP Jencks et al, *Ionization constants of acids and bases*, Handbook of Biochemistry and Molecular Biology, 3rd ed., vol. 1 (Fasman, G.D. ed), pp. 305-351 (1976).

* cited by examiner

HYBRID ORGANIC-INORGANIC NANO-PARTICLES

This application is the U.S. national phase of International Application No. PCT/EP2013/060274 filed 17 May 2013 which designated the U.S. and claims priority to EP 12168870.9 filed 22 May 2012, and EP 12168873.3 filed 22 May 2012, the entire contents of each of which are hereby incorporated by reference.

FIELD

The invention relates to a method of making hybrid organic-inorganic core-shell nano-particles, more specifically to such method comprising the steps of
  a) providing colloidal organic particles as a template;
  b) adding an inorganic oxide precursor; and
  c) forming an inorganic shell layer from the precursor on the template to result in core-shell nano-particles.

The invention also relates to organic-inorganic or hollow-inorganic core-shell nano-particles obtained with this method, to compositions comprising such nano-particles, to different uses of said nano-particles and compositions, and to products comprising or made from said nano-particles and compositions, including anti-reflective coatings and composite materials.

BACKGROUND AND SUMMARY

In the last decade many research groups have been investigating synthesis and properties of hybrid core-shell nano-particles and inorganic hollow nano-particles. The vast number of scientific and patent publications resulting from this work has been reviewed in several articles; including Adv. Mater. 2010, 22, 1182-1195; Nano Today 2009, 4, 494-507; J. Coll. Interf. Sci. 2009, 335, 1-10; and Adv. Mater. 2008, 20, 3987-4019. Various different synthetic strategies for making hollow inorganic particles can be distinguished. A typical approach applies a micro- or nano-sized organic structure in a solvent system as a template or scaffold for forming an inorganic oxide outer layer (also referred to as coating with inorganic oxide), resulting in hybrid core-shell (or coated) nano-particles as intermediate product. Shell layers comprising silica are generally made with a sol-gel process based on the so-called Stöber method, wherein a tetra-alkoxy silane is hydrolysed and condensed in water/alcohol mixtures containing ammonia.

Within the context of this application the template is considered to substantially consists of organic compounds, like polymers with a back-bone based on C, and optionally O, N, S, etc., such that the template or core can be substantially removed from the core-shell particles, for example by dissolution or thermal degradation and evaporation (pyrolysis or calcination). By selectively removing the organic core hollow particles can be obtained; either as such or formed in situ as part of a composition or product. In many cases the inorganic shell formed comprises, or substantially consists of (modified-) silica. Use of silica as a coating or shell material offers various advantages; like versatility in synthetic routes, tailoring of properties of the shell layer, and relatively low cost.

Core-shell and/or hollow nano-particles can be used for many different applications. Their capacity to encapsulate a compound, like a pharmaceutical agent or a catalyst, can be applied in uses ranging from chemical processes to drug delivery and biomedical applications. Characteristics like low density, high surface area, etc. make such nano-particles attractive as catalyst support, as filler material, and as component in optical coatings, like anti-reflection (AR) layers.

Specific properties and compositional characteristics of such nano-particles are depending on the targeted application. For use in AR coatings, for example, particle size of the particles is an important parameter. A single layer AR coating on a transparent substrate typically should have a refractive index between the refractive indices of the substrate and air, in order to reduce the amount of light reflected at the substrate-air interface and increase the amount of light transmitted through the substrate. For example, in case of a glass with refractive index 1.5 the AR layer typically has a refractive index of about 1.2-1.3, and ideally of about 1.22. A porous silica or other inorganic oxide layer having sufficiently high porosity can provide such a low refractive index and function as AR coating, if its layer thickness is about ¼ of the wavelength of the light; meaning that in the relevant wavelength range of 300-800 nm the thickness preferably is in the range 70-200 nm. This of course means that the size and geometry of pores in such coating should be compatible with said layer thickness.

A porous AR coating layer can be made by different approaches using various pore forming agents; of which using porous or hollow particles in a binder or matrix material represents an elegant way to control porosity level and pore sizes. A coating composition comprising prefabricated hollow inorganic nano-particles and a matrix-forming binder based on silica precursors is for example described in EP1447433. Many documents address using organic-inorganic core-shell nano-particles in an AR coating composition. During formation of a cured coating layer the organic core can for example be removed by thermal degradation and evaporation or by selective dissolution, also depending on the type of matrix or binder used. WO2008028640 represents an example of a publication applying such hybrid nano-particles with a sacrificial organic core. In this document cationic polymer micelles or cationically stabilised polymer latex particles are used as organic template for making hybrid core-shell nano-particles and AR coating compositions.

Optimum pore size of such AR coating is not only depending on the coating layer thickness as mentioned above, but also on other desired performance characteristics. For example, if the layer contains very small pores, this may result in non-reversible moisture up-take via capillary condensation; affecting refractive index and making the coating layer more prone to fouling with other components. Such effects have been reported for so-called meso-porous silica having pores in the range 1-20 nm. Too large pores on the other hand may deteriorate mechanical strength of the coating, e.g. reduced abrasion resistance, or result in haze. Ideally, pore size can be controlled and set within the 20-200 nm range, to optimize various properties of the coating.

In case hybrid core-shell nano-particles are applied for making AR coatings, size and shape of the particles are highly dependent on the organic template used. The template is therefore in some publications also referred to as structure-directing agent. In above cited publications and references cited therein, numerous organic compounds, like surfactants and (block-)copolymers that can form colloidal aggregates, have been described as templates. Examples of colloidal aggregates include micelles, worms, vesicles, lattices, and mixed structures.

Nevertheless, there remains a need in industry for a method of making hybrid organic-inorganic core-shell nano-particles with improved control of template particle size and structure, as a tool to improve their performance in use, for example in an AR coating composition comprising core-shell nano-particles thus obtained.

It is therefore an objective of the present invention to provide such an improved method.

The solution to above problem is achieved by providing the method as described herein below and as characterized in the claims.

Accordingly, the present invention provides a method of making hybrid organic-inorganic core-shell nano-particles, comprising the steps of
a) providing colloidal organic particles as a template;
b) adding at least one inorganic oxide precursor; and
c) forming an inorganic shell layer from the precursor on the template to result in core-shell nano-particles,
wherein the template comprises a synthetic polyampholyte, or stated differently,
wherein the colloidal organic particles are based on a synthetic polyampholyte.

Within the context of the present application a polyampholyte is defined as an ampholytic or amphoteric copolymer, i.e. a synthetic (or man-made) copolymer or polyelectrolyte comprising at least one comonomer having a positively charged group and at least one comonomer having a negatively charged group. The polyampholyte thus comprises opposite charges on different pending groups. A copolymer comprising different charges on the same pending group represents a special type generally referred to as a zwitterionic polymer.

A comonomer having a positively or negatively charged group is understood to include a comonomer having a functional group that can be easily ionised, like carboxylic acid groups or tertiary amine groups by changing pH of the solvent system. Stated otherwise, a polyampholyte is a copolymer or polyelectrolyte containing both cationic and anionic groups, and/or their corresponding ionisable groups, and having a net charge under the conditions applied. Some authors define polyampholytes as charged polymers carrying both basic and acidic groups. The polyampholyte can have a positive or a negative net charge, depending on molecular composition and conditions; charge can for example be determined by measuring its zeta-potential (in solution/dispersion). A copolymer with a positive net charge will be called a cationic polyampholyte; negatively net charged copolymers will be referred to as being anionic polyampholytes.

With the method of the invention it is found possible to make colloidal organic particles or aggregates from a synthetic polyampholyte, the colloidal particles having an average particle size in the range of 10 to 300 nm. This particle size can be controlled by the comonomer composition of the polyampholyte, and/or by selecting conditions like temperature, pH, salt concentration, and solvent composition. Selecting and varying conditions to set particle dimensions enables one to make dispersions of colloidal organic particles and subsequently core-shell nano-particles with different particle size starting from one polyampholyte. A further advantage of the present method is that the dispersion of core-shell nano-particles obtained is very stable under different conditions; increasing its shelf life or storage time, and allowing for example altering its concentration and solvent system, making the dispersion suitable for various different application requirements.

With the method of the invention core-shell, and optionally porous or hollow particles can be obtained, which can advantageously be applied in different uses; including encapsulating of functional compounds and ingredients, as filler material in compositions for low-weight or isolating materials, or as component for lowering refractive index of a material like a coating, or for a coating with low gloss (surface roughness).

In WO2001/80823A2 and US2002/0064541A1 compositions comprising core-shell microcapsules for therapeutic or cosmetic use are described. The microcapsules of preferably 8-50 μm diameter are typically prepared by providing a shell comprised of an inorganic polymer around emulsified particles of active ingredient to be encapsulated. In making said emulsified core particles a wetting agent may be used, which can be a surfactant or polymeric surfactant. The polymeric surfactant can be anionic, cationic, amphoteric or non-ionic; and can be a hydrocarbon or a silicone polymer. Within long lists of suitable silicone polymers a silicone amphoteric polymer is mentioned, but the documents do not provide further information and are silent on potential effects of using such non-organic surfactant.

A further specific advantage of the invention is that a coating composition comprising the core-shell particles can be made into a coating with AR properties on a substrate via a thermal treatment at relatively low temperatures compatible with a plastic substrate, as well as at high curing temperature compatible with glass processing.

In the method according to the invention the synthetic polyampholyte used as template particle is an organic copolymer, comprising at least one monomer unit having a cationic charge, at least one monomer unit having an anionic charge, and optionally at least one neutral or non-ionic comonomer. The polymer may be a random, but also a block copolymer. The polyampholyte can be a condensation polymer, like a polyester, polyamide, polyurethane and the like; or an addition polymer, comprising styrenic, acrylic, methacrylic, olefinic, and/or vinylic comonomers. Within the context of this application all these monomers are together referred to as ethylenically unsaturated monomers or vinyl monomers; that is including methacrylates which comprise a methyl-vinyl group. Acrylic and methacrylic compounds are together typically referred to as (meth)acrylic monomers in the art. Preferably, the polyampholyte used in the method according to the invention is an addition polymer, which can advantageously be made using various known polymerisation techniques from a great number of suitable monomers; offering a wide range of compositions for the polyampholyte.

Preparation of such ampholytic addition copolymers for use in the method according to the invention is known from prior art, e.g from U.S. Pat. No. 4,749,762 and a number of documents cited therein. More specifically, U.S. Pat. No. 4,749,762 describes two alternative routes for making polyampholytes from (meth)acrylic monomers. In a one process acrylic acid, N,N-dimethylamine ethylmethacrylate (DMAEMA) or N,N-diethylamine ethylmethacrylate (DEAEMA), and optionally an alkyl(meth)acrylate are polymerised in solution in the presence of a strong acid, during which the amine groups are protonated. Alternatively, such mixture of comonomers—but comprising the methyl ester of acrylic acid—is (emulsion) polymerised, followed by selectively hydrolysing the acrylate ester comonomer (which is much faster than hydrolysis of methacrylate esters).

Synthesis of polyampholytes from various ethylenically unsaturated monomers is also described in U.S. Pat. No. 6,361,768 and references cited therein. Typically a radical polymerisation is performed in an organic solvent, and optionally surfactants are present to prevent agglomeration of copolymer formed.

In EP2178927 a dispersion of a cationic ampholytic copolymer is made by first copolymerising a mixture of monomers, for example methyl methacrylate (MMA), DMAEMA and methacrylic acid (MAA), in bulk or solution; followed by dispersing the copolymer in an aqueous medium (and neutralising non-ionic amine functional groups before or during dispersion).

In the method according to the invention the polyampholyte is preferably a copolymer obtained from
- at least one cationic or basic monomer (M1), including compounds with a pending group that can combine with a proton; like monomers with a tertiary amine group;
- at least one anionic or acidic monomer (M2), including compounds with a pending group that can yield a proton; like monomers containing carboxylic acid groups;
- at least one neutral or non-ionic monomer (M3); preferably a non-water soluble or hydrophobic comonomer; and
- optionally at least one cross-linking monomer (M4).

The ionic comonomers M1 and M2 will increase solubility and dispersability of the copolymer in an aqueous system; whereas presence of non-ionic monomer units M3 may reduce solubility, but promote forming aggregates. Too high an amount of M3 may result in insolubility and/or precipitation of the copolymer. The type and amount of M3 is thus preferably chosen such that the polymer can still be dispersed in an aqueous medium into colloidal particles, M3 units promoting self-association by non-polar or hydrophobic interaction. Optionally, the copolymer may comprise a small amount of di- or polyfunctional monomer M4, which will induce a level of cross-linking that may further stabilize the colloidal particles formed. Typically such random copolymers can already form suitable aggregates in an aqueous medium; thus omitting the need to use more complex synthetic routes of making block copolymers.

DETAILED DESCRIPTION

Figure 1:
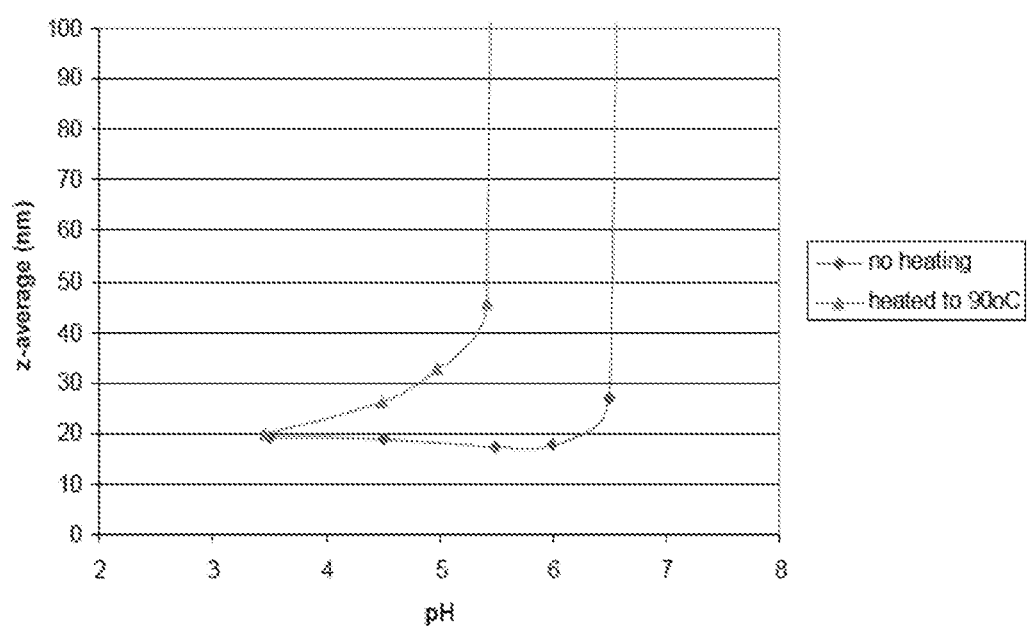
FIG. 1 is a graph of the z-average particle size (nm) of the polyampholyte colloidal dispersion versus pH according to the results obtained in Example 2 hereinbelow.

In a preferred embodiment, the polyampholyte used in the method according to the invention is such a copolymer obtained from
- 0.1-40 mole % of at least one monomer M1;
- 0.1-40 mole % of at least one monomer M2;
- 18-98.8 mole % of at least one monomer M3; and
- 0-2 mole % of at least one monomer M4 (with the sum of M1, M2, M3 and M4 adding up to 100%).

A molar excess of M1 over M2 results in a cationic polyampholyte, an excess of M2 over M1 in an anionic polyampholyte, also depending on e.g. pH. Preferably, the polyampholyte used in the method according to the invention is a cationic copolymer, more specifically such a cationic copolymer obtained from
- 5-40 mole % of at least one monomer M1;
- 0.5-20 mole % of at least one monomer M2;
- 38-94.5 mole % of at least one monomer M3; and
- 0-2 mole % of at least one monomer M4;

the polyampholyte comprising more M1 than M2 monomer units and having a net positive charge.

In further preferred embodiments, the polyampholyte used in the method according to the invention is such a cationic copolymer obtained from at least 6, 7, 8, 9 or 10 mole %, and at most 35, 30, 25, 20 or 16 mole % of at least one monomer M1; from at least 0.6, 0.7, 0.8, 0.9 or 1 mole %, and most 15, 10, 8, 6, 5 or 4 mole % of at least one monomer M2; and at least one monomer M3 in such amount that the sum of M1, M2, and M3 is 100 mole %.

In embodiments of the invention wherein an anionic polyampholyte is used, preferred ranges for M1 and M2 are similar to M2 and M1, respectively, as mentioned for a cationic polyampholyte.

Cationic monomers M1 that can be suitably used in forming the polyampholyte used the method according to the invention via addition polymerisation include vinyl monomers with a pending amino functional group; which can be non-ionic monomers that can be neutralised during or after forming the copolymer, monomers with an already neutralised amino functional group, or vinyl monomers with a permanent quaternary ammonium group.

Examples of vinyl monomers bearing non-ionic amino functional groups include N,N-dimethylaminoethyl(meth)acrylate, N,N-dimethylaminohexyl(meth)acrylate, N,N-diethylaminoethyl(meth)acrylate, N-methyl-N-butyl-aminoethyl(meth)acrylate, tert-butylaminoethyl(meth)acrylate, N,N-dimethylaminopropyl(meth)acrylate, 2-(1,1,3,3-tetramethylbutylamino)ethyl(meth)acrylate, beta-morpholinoethyl(meth)acrylate, 4-(beta-acryloxyethyl)pyridine, vinylbenzylamines, vinylphenylamines, 2-vinylpyridines or 4-vinylpyridines, p-aminostyrenes, dialkyaminostyrenes such as N,N-diaminomethylstyrene, substituted diallylamines, N-vinylpiperidines, N-vinylimidazole, N-vinylimidazoline, N-vinylpyrazole, N-vinylindole, N-substituted (meth)acryl amides like 2-(dimethylamino)ethyl(meth)acrylamide, 2-(t-butylamino)ethyl(meth)acrylamide, 3-(dimethylamino)propyl(meth)acrylamide, (meth)acryl amide, N-aminoalkyl(meth)acrylamides, vinyl ethers like 10-aminodecyl vinyl ether, 9-aminooctyl vinyl ether, 6-(diethylamino)hexyl vinyl ether, 5-aminopentyl vinyl ether, 3-aminopropyl vinyl ether, 2-aminoethyl vinyl ether, 2-aminobutyl vinyl ether, 4-aminobutyl vinyl ether, 2-dimethylaminoethyl vinyl ether, N-(3,5,5-triethylhexyl)aminoethyl vinyl ether, N-cyclohexylaminoethyl vinyl ether, N-tert-butylaminoethyl vinyl ether, N-methylaminoethyl vinyl ether, N-2-ethylhexylaminoethyl vinyl ether, N-t-octylaminoethyl vinyl ether, beta-pyrrolidinoethyl vinyl ether, or (N-beta-hydroxyethyl-N-methyl)aminoethyl vinyl ether. Cyclic ureido or thiourea containing ethylenically unsaturated monomers like (meth)acryloxyethyl ethyleneurea, (meth)acryloxyethyl ethylenethiourea (meth)acrylamide ethyleneurea, (meth)acrylamide ethylenethiourea and alike can also be used. Preferred monomers are amino-functional (meth)acrylates and (meth)acrylamides; especially N,N-dialkylaminoalkyl(meth)acrylates, more specifically t-butylaminoethyl methacrylate, dimethylaminopropyl methacrylate, dimethylaminoethyl methacrylate (DMAEMA) or diethylaminoethyl methacrylate (DEAEMA), more preferably DMAEMA and DEAEMA.

The above given examples of suitable and preferred non-ionic M1 monomers can also be used in their ionised form, by treating with for example an acid, preferably an organic acid like a carboxylic acid, prior to polymerisation.

Suitable examples of M1 monomers with a permanent quaternary ammonium group include methacrylamidopropyl trimethylammonium chloride (MAPTAC), diallyl dimethyl ammonium chloride (DADMAC), 2-trimethyl ammonium ethyl methacrylic chloride (TMAEMC) and quaternary ammonium salts of substituted (meth)acrylic and (meth)acrylamido monomers.

Anionic or acidic monomers M2 that can be suitably used in forming the polyampholyte used in the method according to the invention via addition polymerisation include vinyl monomers with a pending phosphoric, sulfonic, or carboxylic acid group. Preferably vinyl monomers with a carboxylic acid group are used, examples including ethylenically unsaturated monocarboxylic and/or dicarboxylic acids, like fumaric acid, itaconic acid, maleic acid, and especially (meth)acrylic monomers with a carboxylic acid group, such as acrylic acid (AA), methacrylic acid (MAA) and β-carboxy ethylacrylate. Preferred M2 monomers are acrylic acid and methacrylic acid.

Neutral or non-ionic monomers M3 that can be suitably used in forming the polyampholyte used the method according to the invention via addition polymerisation include a wide range of ethylenically unsaturated monomers or vinyl monomers, including various styrenic, (meth)acrylic, olefinic, and/or vinylic comonomers. The at least one monomer M3 may be hydrophilic or hydrophobic, or a mixture of both. Preferably, the ampholytic copolymer comprises a certain amount of non-water soluble or hydrophobic comonomers, which will promote the copolymer, not being fully water soluble, to self-assemble in to colloidal particles or aggregates in an aqueous medium. The skilled person will be able to select suitable combinations of monomers and their contents based on the information disclosed in this description and experiments, possibly assisted by some further experiments; and depending on copolymer composition (like M1 and M2 types and amounts) and conditions (like solvent composition, temperature, pH).

Suitable styrene monomers M3 include styrene, alpha-methyl styrene and other substituted styrenes. Suitable (meth)acrylic monomers M3 include alkyl or cycloalkyl (meth)acrylates, preferably $C_1$-$C_{18}$ alkyl(meth)acrylates or $C_1$-$C_8$ alkyl(meth)acrylates, like methyl(meth)acrylate, ethyl(meth)acrylate, butyl(meth)acrylate (all isomers), isobutyl (meth)acrylate, 2-ethylhexyl(meth)acrylate, isopropyl (meth)acrylate, propyl(meth)acrylate (all isomers). Most preferred (meth)acrylic monomers include methyl methacrylate (MMA), ethyl methacrylate (EMA), n-butyl methacrylate (BMA). Similarly, N-alkyl(meth)acrylamides can be used as monomer M3. Also other monomers that can be copolymerized with M1 and M2 can be used as monomer M3, including acrylonitrile, methacrylonitrile, butadiene; vinyl monomers like vinyl chloride, vinyl pyrrolidone, vinyl esters such as vinyl acetate, vinyl propionate, vinyl laurate, vinyl alkyl ethers, and the like.

Suitable examples of di- or polyfunctional monomer M4 include allyl methacrylate, divinyl benzene, ethyleneglycol di(meth)acrylate, butanediol di(meth)acrylate, trimethylolethane tri(meth)acrylate and trimethylolpropane tri(meth)acrylate. Preferably a difunctional monomer is used, preferably in amount of 0-1 mole % based on the polyampholyte.

In a preferred embodiment of the method according to the invention, the polyampholyte is a cationic copolymer obtained from
- 8-20 mole % of at least one monomer M1 selected from the group consisting of amino-functional (meth)acrylates and (meth)acrylamides;
- 1-4 mole % of at least one monomer M2 selected from the group of (meth)acrylic monomers with a carboxylic acid group; and
- 76-91 mole % of at least one monomer M3 selected from the group of C1-C18 alkyl(meth)acrylates.

In the method according to the invention the molar mass of the polyampholyte can vary widely. Typically, the polyampholyte is a copolymer having a weight averaged molar mass (Mw) in the range 1-500 kDa (kg/mol), preferably Mw is at least 2, 5, 10, 15 or even 20 kDa, but at most 250, 200, 150, 100, 50 or even 35 kDa to optimise colloidal aggregate formation. The molar mass of the copolymer can be determined by gel permeation chromatography (GPC) using polymethylmethacrylates of known molar masses as a standard and hexafluoro iso-propanol as a solvent.

In the method according to the invention the step of providing colloidal organic particles as a template comprises making a colloidal dispersion of the polyampholyte in an aqueous medium, as known from documents cited above. For example, if a cationic polyampholyte is prepared by solution polymerisation, the resulting solution can be, optionally after partially removing solvent, dispersed into a acidic solution of e.g. formic acid in water, typically at ambient conditions (see eg EP2178927). In case of an anionic polyampholyte, a pH of above 7 is preferred for dispersing. Formation of colloidal particles or aggregates, e.g. by self-association of the polyampholyte in the aqueous system, can be monitored by various techniques; for example by Dynamic Light Scattering (DLS). The aqueous medium may comprise organic solvents that are miscible with or at least can be dissolved in water, like alcohols, ketones, esters, or ethers. Examples include 1,4-dioxane, acetone, diethylacetate, propanol, ethanol, methanol, butanol, methyl ethyl ketone, methyl propyl ketone, and tetrahydrofuran. Preferably, the solvent comprises water and a lower (C1-C8) aliphatic alcohol, like methanol, ethanol, iso-propanol or 1-methoxypropan-2-ol; more preferably ethanol or iso-propanol. The amount of organic solvent used is chosen such that the copolymer is dispersed rather than dissolved. Preferably the solvent composition of the aqueous medium is also suitable for the subsequent step of forming a shell layer.

If desired, in the method according to the invention a further surfactant may be present, to ease formation of dispersed copolymer aggregates and to further stabilise the dispersion obtained. The surfactant used may be non-ionic, cationic or anionic, or a combination thereof depending the type of polyampholyte and conditions, like pH. Preferably only small amount of surfactant is used, like 0.1-1.5, preferably 0.2-1.0 mass %

In the method according to the invention the polyampholyte dispersion can have a concentration within wide ranges, for example from 1-45 or 2-40 mass %, preferably about 10-25 mass % (polymer based on dispersion).

The average particle size of the colloidal particles or aggregates as obtained and as measured by DLS may vary widely, for example from 5 to 500 nm. Preferably the average size of the colloidal particles is at least about 10, 15, 20, 25, or 30, and at most about –300, 250, 200, 150 or 100 nm, depending on intended use. Particle size is found to be not only dependent on molecular composition of the polyampholyte, but also on the dispersion conditions, like solvent composition, concentration of polyampholyte, pH, temperature, salt concentration, etc.

It was further found that the particle size of the colloidal aggregates in the obtained dispersion is relatively stable within certain ranges of temperature or pH, but may be adjusted by submitting the dispersion to a larger change in conditions, or by changing both pH and temperature. Although the inventors do not wish to be bound to any theory, they believe the ampholytic character of the copolymer plays a distinct role, e.g. by intra- and/or intermolecular association of pending ionic groups of opposite charge.

The invention therefore also relates to a method of making hybrid organic-inorganic colloidal particles wherein the colloidal organic particles are provided by dispersing the synthetic polyampholyte in an aqueous medium, and by adjusting particle size by changing both pH and temperature. For example, in case of an aqueous colloidal dispersion of a cationic polyampholyte containing about 14 mole % of DMAEMA, 3.5 mole % MAA and 82.5 mole % MMA initial particle size after dispersing at pH 4.5 was about 140 nm, and remained fairly constant upon lowering pH from about 4.5 to 2.5, or increasing temperature from ambient to about 90° C. Bringing the pH to below about 4 and heating to above about 60° C., however, resulted in particles of about 20 nm. Also these particles were found to be stable; only by increasing the pH to near the isoelectric point of the polyampholyte the size of these particles increased again, and resulting in gel formation. With the method of the invention it is thus possible to make dispersions of colloidal organic particles with tunable particle size, by varying composition of the starting polyampholyte and/or by varying conditions of the dispersion.

Typically, with the method of the invention it is thus possible to obtain a colloidal dispersion from the synthetic polyampholyte, and to adjust its average particle size to within the range of 10 to 300 nm; preferably 15-200, 15-150, 15-100, 20-75 or 25-60 nm.

Particle size of colloidal particles as measured by DLS provides an indication of the hydrodynamic volume of the polymer aggregates, especially of the larger particles, and may differ from sizes as measured with other techniques on these or subsequently made particles. Nevertheless, a correlation between sizes of colloidal particles and other parameters during subsequent use of the particles may exist; as is observed for pore size of cured coatings. Coatings based on particles with certain minimum size are found to show reversible water absorption/desorption curves, whereas small particles, of e.g. below 20 nm, may result in a coating that absorbs water which is hardly desorbed again under ambient conditions (also referred to as capillary condensation effect).

The dispersed colloidal polyampholyte particles are not considered to be 'hard' particles consisting of only polyampholyte, but to contain water (and solvent) swollen polyampholyte. The colloidal organic particles can be described to substantially consist of at least partly solvated polyampholyte aggregates. It is further likely that ionic groups will be predominantly present in an outer layer, with polymer chains protruding into the aqueous medium, and non-ionic groups more inside the particle.

The invention also relates to a method of making hybrid organic-inorganic colloidal particles, comprising a step of providing colloidal organic particles by dispersing the synthetic polyampholyte in an aqueous medium, and further comprising adding a functional compound to the dispersion obtained, such that the functional compound is contained in the organic particles. After subsequently forming a shell layer from the precursor on the template to result in core-shell nano-particles, the functional compound is contained in the core; or stated differently, within the core-shell particle or microcapsule. Functional compounds thus encapsulated can be selected from a wide range of compounds. Typically, the compound will have limited water solubility, such that is preferentially taken up by the colloidal particles; which can also be considered an oil-in-water dispersion. Examples of functional compounds that can be encapsulated in core-shell nano-particles by present method, may for example include organic compounds or solvents, which later on can be evaporated from the particles to result in a porous or hollow core; biologically or pharmaceutically active compounds for controlled-release purposes; cosmetic ingredients; catalysts; organic dyes for use as sensor or indicator; and other compounds and applications as described in literature. The functional compound may diffuse through the shell layer, or be released by some external stimulus like (mechanically) disrupting the shell; e.g. upon applying a cosmetic lotion onto the skin. The colloidal organic particles used as template in the method according to the invention may thus comprise synthetic polyampholyte, water, organic solvent, surfactant and functional compound. Preferably the colloidal particles substantially consist of synthetic polyampholyte, water, organic solvent, and surfactant. In a further preferred embodiment of the invention, the colloidal organic particles substantially consist of synthetic polyampholyte, water, organic solvent and functional compound, more preferably of synthetic polyampholyte, water and organic solvent.

The method according to the invention comprises the steps of a) providing colloidal organic particles comprising a synthetic polyampholyte as a template; b) adding at least one inorganic oxide precursor; and c) forming a shell layer from the precursor on the template to result in core-shell nano-particles. Such formation of an inorganic shell layer, typically by a sol-gel process, has been described in many publications, including documents cited in this application, and publications referenced therein. Suitable inorganic oxide precursors include metal salts, metal chelates and organo-metallic compounds, preferably metal alkoxides, and combinations thereof. Such compounds can undergo various hydrolysis and/or condensation reactions to form corresponding oxides or mixed oxides. Within the present application silicon (Si) is considered to be a metal. Suitable metals include Si, Al, Bi, B, In, Ge, Hf, La and lanthanoids, Sb, Sn, Ti, Ta, Nb, Y, Zn and Zr, and mixtures thereof, preferably the metal is at least one of Si, Al, Ti, and Zr. Preferred precursors include alkoxy silanes like tetramethoxy silane (TMOS), tetraethoxy silane (TEOS), methyltrimethoxy silane, methyltriethoxy silane, titanium tetraisopropoxide, aluminium nitrate, aluminium butoxide, yttrium nitrate and zirconium butoxide. Such precursor compounds can have been partially pre-reacted or pre-hydrolysed to form oligomeric species, typically in the form of nano-sized particles of about 1-20 nm; also called sol particles.

In a preferred embodiment of the invention, the at least one inorganic precursor comprises an alkoxy silane, more preferably TMOS and/or TEOS. Preferably, the shell layer formed substantially consists of silica; the shell for example comprises at least 80, 85, or 90 mole % of Si as metal in the inorganic oxide, more preferably at least 95 mole % of Si.

In the method according to the invention the step of forming a shell layer from the precursor on the template to result in core-shell nano-particles is typically performed under mild conditions and in aqueous medium. As mentioned above, the aqueous medium may comprise an organic solvent that is miscible with water, like alcohols, ketones, esters, or ethers; preferably an alcohol like methanol, ethanol or iso-propanol. Water serves as solvent or diluent for the composition, but may also react with the inorganic oxide precursor; for example with an alkoxy silane. The amount of water present in the composition is therefore preferably at least the amount needed for such desired reaction(s), like (partial) hydrolysis of for example tetraethoxy silane. In case complete hydrolysis of TEOS would be aimed at, the composition should contain water in at least a 4:1 molar ratio to Si.

The temperature is not very critical in the process of the invention and can be varied widely as long as the polyampholyte dispersion is not disrupted. Temperature can be up to 100° C., but is typically ambient, i.e. from about 15 to 40° C. As said hydrolysis reaction is exothermic, cooling may be used to control temperature in this step. The pH is chosen in acidic or basic range, dependent on the type of polyampholyte: in case of a cationic polyampholyte the pH is in the range 2-6, preferably 3-5 or 3-4.5, if an anionic polyampholyte is used pH is about 8-12, preferably 9-11 or 9-10. An advantage of applying such conditions is that nanoparticles formed from the precursor and typically having a charge, will at least partly deposit on the colloidal polyampholyte particles of opposite charge. This way an open or 'fluffy', or even more condensed layer of inorganic oxide (precursor) may form around the polyampholyte particles.

These above described steps of the process according to the invention are typically performed at ambient pressure, but increased (or reduced) pressure may also be applied.

In the method according to the invention forming a shell layer from the precursor on the template is typically performed at a mass ratio of inorganic oxide to organic template of about 0.25 to 5, preferably 0.5-2, more preferably 1-1.8.

In the method according to the invention forming of a shell layer from the precursor on the template may be monitored by measuring change in dimensions of the colloidal particles, eg by DLS. Although the DLS technique has its draw-backs, for example mainly detecting the larger particles, and particle size may also change as result of compounds liberated from the precursor, like an alcohol, being absorbed in the core, it is a simple and convenient method to observe shell formation. Shell formation may slow down or stop when the net charge of the colloidal particle has decreased by the inorganic oxide (precursor) having charge opposite to that of the polyampholyte. A certain charge level will likely remain to keep the particles dispersed. As shell formation is thought to result from complexing of inorganic nanoparticles with the polyampholyte outer layer, an open or fluffy structure is expected to be formed rather than a dense shell.

In embodiments of the method according to the invention the structure of the shell formed, like its density or surface properties, may be further optimized by extending reaction time, reacting with a coupling agent or other treatment as known from the art. Thickness of the shell layer thus formed is typically in the range of 1-20 nm, preferably 2-10 nm. Shell thickness of core-shell nano-particles, and their morphology can be assessed on particles with techniques like TEM, especially cryo-TEM, SAXS, SANS, or AFM.

In a special embodiment of the method of the invention, shell formation may be continued after growth apparently has stopped, by using a layer-by-layer approach as originally described by Caruso et al. (see e.g. WO9947253). A multilayer shell may thus be formed, by alternatingly adding additional amounts of the polyampholyte or another polyelectrolyte of same (positive or negative) net charge, and inorganic oxide precursor. With such method thicker shell layers may be obtained, for example up to 25, 30, 40 or even 50 nm.

The core-shell nano-particles made with the method according to the invention can be of any suitable size, but preferably have an average particle size of at most 500 nm, more preferably at most 400, 300, 200, 150, 100, or even 75 nm. Particle size is defined as 0.5×(length+width) for non-spherical particles and as the radius for spherical particles. Preferably, the average particle size is 10 nm or more, more preferably at least 15, 20, 25 or 30 nm. The average size of the particles may be determined by spreading a dilute suspension of the particles over a surface and measuring the sizes of individual particles by using microscopic techniques, preferably electron microscopy (SEM or TEM) or atomic force microscopy (AFM) on a certain number—like 100—of dry particles, or by Dynamic Light Scattering (DLS) on dispersions.

In a preferred embodiment the method according to the invention further comprises a step of stabilising the dispersion obtained by diluting the dispersion to below e.g. 5 or 3 mass %, preferably with solvents as mentioned above, and/or by changing pH. Storing at low temperatures, preferably below room temperature, more preferably below 15 or 10° C. but above freezing temperature, will also increase shelf-life of the composition.

In a further aspect the method according to the invention further comprises a step of stabilising the dispersion obtained by changing the pH to a level at which the inorganic oxide and/or its precursors will not react, including reacting at least only very slowly, to prevent agglomeration of core-shell particles; in case of silica precursors preferably to a pH of about 2-3 (as measured with a standard pH electrode on aqueous or alcoholic dispersion).

The method according to the invention may also comprise a further step of at least partially removing the template from the core-shell nano-particles to result in a porous or hollow core (for simplicity together referred to as hollow core). The organic core of the core-shell particle comprises solvated polyampholyte aggregates, that is organic polymer and solvent including water and organic solvent. This core can be at least partly removed by evaporating volatile components like solvent; and/or by solvent extraction or etching, thermal degradation, catalytic decomposition, photo-degradation, electron beam or laser irradiation, and combinations thereof; optionally followed by evaporating the degradation products. Core material may be removed, partially or virtually completely, while the nano-particles are still in dispersed form, but also during or after separating the particles from the dispersion for a subsequent use, or during or after applying the dispersion to form a composition for a subsequent use, for example making a coating composition and forming a coating layer. When the core material is to be removed before subsequent use or application, this may be achieved in any suitable manner at any suitable point in the method according to the invention.

In a preferred embodiment of the method of the invention the core is at least partly removed after the obtained dispersion of nano-particles has been made in to a coating composition for use in forming a coating layer on a substrate. Therefore, the scope of the present invention encompasses coating compositions comprising core-shell particles wherein the core is present and also wherein the core has been partially or fully removed.

The products directly obtained with the method according to the invention are hybrid organic-inorganic colloidal particles, or more specifically an aqueous dispersion of core-shell nano-particles (more particularly a dispersion of organic-inorganic or hollow-inorganic core-shell nano-particles). Such dispersion is found to show remarkably good storage and handling stability, meaning the dispersion shows little tendency to changing viscosity or gelling compared to other sol-gel process based dispersions. It was further surprisingly found that the dispersion may be even exposed to elevated temperatures; allowing at least part of the solvent, including water, to be removed by evaporation with or without reducing pressure, and thus to increase the solids content of the dispersion. Surprisingly, also such concentrated dispersion showed good stability during further handling. This greatly increases the possibilities for using the dispersion obtained in a number of different applications. The method according to the invention therefore preferably contains a further step of increasing the solids content by partly removing solvent.

For some applications it may be desirable the method of the invention further comprises an optional step of separating the nano-particles from the dispersion obtained, especially in case of nano-particles comprising a functional compound (see later). Such separation step can include any known method; like filtration, freeze-drying or spray-drying techniques.

The invention therefore also relates to the core-shell nano-particles obtained with the method according to the invention, either as an aqueous dispersion of hybrid organic-inorganic colloidal particles, or as organic-inorganic core-shell nano-particles or hollow-inorganic core-shell nano-particles as such. In a special embodiment the invention concerns such core-shell nano-particles comprising a functional compound, or stated otherwise, the invention relates to a functional compound encapsulated in core-shell nano-particles as obtained with the method according to the invention.

The invention further relates to compositions comprising the organic-inorganic nano-particles or hollow-inorganic core-shell nano-particles as obtained with the method according to the invention, like coating compositions including optical, especially anti-reflective coating compositions; and to different uses of said nano-particles and compositions, as well as to products comprising or made from said nano-particles and compositions, including anti-reflective coatings, cosmetic compositions, controlled-release medicaments, and composite materials.

The advantageous properties of the organic-inorganic nano-particles or hollow-inorganic core-shell nano-particles relate back to the process applying a synthetic polyampholyte as template. The invention therefore also concerns the use of the polyampholyte as defined herein above including all preferred features and embodiments for making hybrid colloidal particles, organic-inorganic core-shell nano-particles or hollow-inorganic core-shell nano-particles, and various coating compositions or polymer compositions.

In a preferred embodiment the invention relates a coating composition that can be used for making a coating on a substrate, especially a porous inorganic oxide coating on a substrate. Porosity of the coating will depend on the relative amount of core-shell particles in the composition, and on core material that is removed therefrom during forming the coating. Depending on o.a. solids content of the composition and applied coating layer thickness coatings with different properties for different uses can be made from the coating composition, including hard coats, low friction coatings, and AR coatings.

Preferably, the invention also concerns a coating composition suitable for making an anti-reflective layer on a substrate, comprising the organic-inorganic core-shell nano-particles or hollow-inorganic core-shell nano-particles obtained with the method according to the invention, at least one solvent and optionally at least one binder. With solvent is meant a liquid component that contains the other coating components in dissolved, or dispersed or colloidal states, and could thus also be referred to as diluent.

The at least one solvent in the coating composition of the invention typically comprises water, which may partly originate from the method of making the nano-particles. Depending on the nature of the binder and other components that can be optionally present, various other solvents can be used in the composition of the invention, including non-protic and protic organic solvents, like ketones, esters, ethers, alcohols, glycols, and mixtures thereof. Suitable other solvents are miscible with water or can at least dissolve a certain amount of water. Examples include 1,4-dioxane, acetone, diethylacetate, propanol, ethanol, methanol, butanol, methyl ethyl ketone, methyl propyl ketone, and tetrahydrofuran. Preferably, the solvent comprises a lower (C1-C8) aliphatic alcohol, like methanol, ethanol, iso-propanol or 1-methoxypropan-2-ol; more preferably the solvent comprises ethanol or iso-propanol; and a certain amount of water.

The amount of solvent can be varied to obtain a desired viscosity of the coating composition, which viscosity may be relatively low to allow easy application to a substrate in thin films, e.g. for use as optical coating. Typically the viscosity of the coating composition is at least about 0.6 mPa·s, preferably at least 1.0 or 2.0 mPa·s. The viscosity may as high as 1000 mPa·s for other applications, for example for making hard coats or low-friction coatings, also depending on the application or deposition method. Preferably viscosity is at most 500, 300 or 200 mPa·s. for making thin layers of homogeneous thickness. The viscosity can be measured with known methods, for example with an Ubbelohde PSL ASTM IP no 1 (type 27042) especially for low viscosity ranges, or with a Brookfield viscometer.

Preferably, the coating composition further comprises a binder, which can be at least one inorganic or organic polymeric or polymerisable compound. The binder may act as film former and hold together the nano-particles, resulting in improved mechanical properties of the coating formed and better adhesion to a substrate upon drying and/or curing. Suitable organic binders include a range of different polymers and thermal or radiation curable monomers, as known to the skilled person. Organic binders can especially be used in case the nano-particles comprise a volatile component in the core or are hollow particles. If the nano-particles comprise an organic polymer core which is to be removed, inorganic binders are preferred; because these allow simultaneous curing of binder and removal of organic core by calcination at elevated temperatures of about 250-900° C.

Suitable inorganic binders in the coating composition of the invention include inorganic oxide precursors like metal alkoxides, metal chelates and metal salts. Metal is understood to include silicon (Si) within the context of this description. Suitable metals include at least one element selected from Si, Al, Be, Bi, B, Fe, Mg, Na, K, In, Ge, Hf, La and lanthanoids, Sb, Sn, Ti, Ta, Nb, Y, Zn and Zr; preferably the metal is at least one element selected from Si, Al, Ti, and Zr. Suitable inorganic oxide precursors include those compounds that can react via hydrolysis and/or condensation reactions to form the corresponding oxide, as is well known in the art. The inorganic oxide precursor can be a metal salt or an organo-metallic compound, like an alkoxy, an aryloxy, a halogenide, a nitrate, or a sulphate compound, and combinations thereof. Preferred precursors include alkoxy silanes, including halogenated derivatives, like tetramethoxy silane (TMOS), tetraethoxy silane (TEOS), methyltrimethoxy silane, methyltriethoxy silane, titanium tetraisopropoxide, aluminium nitrate, aluminium butoxide, yttrium nitrate and zirconium butoxide. More preferably, the precursor comprises TMOS and/or TEOS.

The inorganic oxide precursor can be a mixture of inorganic oxide precursor compound and corresponding inorganic oxide. Such mixture may for example result in case a precursor compound has been partially pre-reacted or pre-hydrolysed to form oligomeric species, typically in the form of nano-sized particles; which is a well-known procedure in sol-gel technology.

In a further preferred embodiment, the binder in the coating composition of the invention comprises a mixture of different inorganic oxide precursors, in which case typically a mixed inorganic oxide is formed, as is known for e.g. different glasses. In such mixed oxide the elements are connected via oxygen atoms to form part of an ionic or covalent network, rather than that they are present as a physical mixture of different oxides. Within the context of the present disclosure, mixed inorganic oxide refers to such definition. Formation of a mixed oxide may e.g. be determined by assessing changes in iso-electric point of oxides—e.g in the form of thin layers—formed from different compositions, or by analytical techniques, like IR and solid-state NMR. Nevertheless, it is customary in the art to define the composition of such mixed inorganic oxide by the theoretical amounts of inorganic oxide for each metal present; e.g. the composition of an aluminosilicate made from Si- and Al-oxide precursors is typically expressed in silica and alumina contents. In case of a mixed oxide as binder, a main metal element is preferably selected from Si, Al, Ti, and Zr, and a second element selected from Si, Al, Be, Bi, B, Fe, Mg, Na, K, In, Ge, Hf, La and lanthanoids, Sb, Sn, Ti, Ta, Nb, Y, Zn and Zr; with a molar ratio of main to second element of about 75:25 to 99:1.

Preferably, the binder in the coating composition comprises a mixture of a silica precursor and a precursor for Al-oxide or Y-oxide, as the mixed oxide formed shows high outdoor resistance or durability.

The coating composition according to the invention may also comprise a combination of inorganic and organic binders, to for example further improve properties of the resulting coating, like anti-fouling behaviour, or enhance adhesion to the substrate. These binders may form polymers or networks on their own, but can also co-react.

In a preferred embodiment, the binder in the coating composition according to the invention substantially consists of at least one inorganic oxide precursor.

The amount of nano-particles in the coating composition according to the invention is dependent on its use as coating and can vary widely. For proper anti-reflective properties nano-particles content can be for example more than 50 mass % based on solids, preferably more than 60 or 70 mass % in the final coating. The concentration of solids or solids content is the content of all components that do not evaporate after the coating composition has been applied to a substrate and subsequently dried and, if required, cured.

The coating composition according to the invention may in addition to nano-particles and binder optionally comprise other non-volatile or solid components, preferably no more than 20 or 10 mass %, more preferably no more than 5 mass % based on solids. These components may be added to affect other functionalities of the coating or assist in the processing of the coating composition. Examples of other components include organic binder, buffer agents, catalysts, coupling agents, surfactants, anti-foaming agents, chelating agents, slip agents and leveling agents.

The coating composition of the invention typically has a solids content of less than about 20, 15 or 10 mass %, and a minimum solids content of about 0.1 mass %, preferably at least 0.2, 0.5 or 1.0 mass %.

It is found that the coating composition according to the invention shows good stability over time; i.e. the liquid can be stored at ambient conditions without significant changes in viscosity or size of dispersed particles; which is surprising because compositions based on a sol-gel system generally show limited shelf life.

In a further aspect the invention relates to a process for making a porous inorganic oxide coating on a substrate comprising the steps of
applying the coating composition according to the invention to the substrate; and
drying and curing the applied coating layer.

In a preferred embodiment the invention relates to a process for making an anti-reflective (AR) coated transparent substrate comprising the steps of
applying the coating composition according to the invention to the substrate; and
drying and curing the applied coating layer.

The transparent substrate on which the coating composition according to the invention can be applied can vary widely, and can be organic or inorganic and of various geometries. Preferably, the substrate is transparent for visible light. Suitable substrates include inorganic glasses (e.g. borosilicate glass, soda lime glass, glass ceramic, aluminosilicate glass) and plastics (e.g. PET, PC, TAC, PMMA, PE, PP, PVC and PS) or composite materials like laminates. Preferably the substrate is a glass, like borosilicate glass; preferably a flat glass like float glass with smooth or patterned surface.

The coating composition of the invention can be applied directly to the substrate, but also to another coating layer already present on the substrate; like a barrier layer for alkali ions, or an adhesion promoting layer.

The process according to the invention may also apply more than one coating layer, with intermediate drying performed after the application of each layer. In some embodiments, intermediate drying and curing is performed after applying some or all of the layers.

In the method according to the invention the coating composition can be applied to the substrate with various deposition techniques, as known to a skilled person for making thin homogeneous coating layers. Suitable methods include spin-coating, dip-coating, spray-coating, roll-coating, slot die-coating, and the like. Preferred methods are dip-coating, roll-coating and slot die-coating. The thickness of the wet coating layer to be applied depends on the amount of solid film forming components in the coating composition, and on the desired layer thickness after subsequent drying and curing. The skilled person will be able to select appropriate methods and conditions depending on the situation.

The coating composition is applied to the substrate for making a (single layer) AR coating in such wet thickness that will result in a thickness after drying and/or curing of about 20 nm or more, preferably the applied coating has a layer thickness of at least about 50 or 70 nm and at most about 160 or 140 nm. In case of a multi-layer coating the skilled person may select different layer thicknesses.

In the process according to the invention the steps of drying and curing the applied coating composition will comprise evaporating the solvent(s) and other volatile components, reacting the binder to form inorganic oxide(s), and removing the organic core from the nano-particles.

Drying preferably takes place under ambient conditions (e.g. 15-30° C.), although elevated temperatures (e.g. up to about 250° C., more preferably up to 100, 50 or 40° C.) may also be used to shorten the total drying time. Drying may be controlled by applying an inert gas flow, or reducing pressure. Specific drying conditions may be determined by a person skilled in the art based upon the solvent or diluent to be evaporated.

During drying also solvent contained in the core-shell particles may at least partly be removed; resulting in pores or voids that may still comprise polyampholyte. This process will also result in a certain porosity and AR properties of the coating, even without fully removing all organics including the polyampholyte. An advantage hereof is that an AR coating can be made at relatively low temperature, allowing to apply an AR coating on substrates with limited thermal resistance, like plastic substrates. In such way of performing the process of the invention, also the curing step can be performed at a temperature compatible with the substrate. After curing, a substrate coated with a hybrid organic-inorganic coating showing AR properties is thus obtained.

After drying, i.e. after substantially removing volatile components, the coating layer is preferably cured. Curing may be performed using a number of techniques including thermal curing, flash curing, UV curing, electron beam curing, laser induced curing, gamma radiation curing, plasma curing, microwave curing and combinations thereof. Curing conditions are depending on the coating composition and curing mechanism of the binder, and on the type of substrate. For example, in case of a glass substrate curing can be performed at relatively high temperatures; for example up to the softening temperature of the glass. This has the advantage that organic compounds present in the coating layer, including the organic core in a core-shell particle, can be thermally removed. A further advantage is that curing can be combined with a glass tempering step; i.e. heating the glass to about 600-700° C. followed by quenching, to result in toughened or safety glass.

In case the substrate is an organic polymer, curing temperature is generally limited to below the melting or softening point of the semi-crystalline or amorphous polymer, or should take place in a very short time. Alternatively, flash heating may advantageously be applied to minimise exposure of the substrate to high temperature; as is for example described in WO2012037234. Use of a radiation curable binder offers specific advantages in case of an organic substrate with limited temperature resistance. Alternatively, after drying and optionally curing the coating, organic pore formers present can be removed by other methods; for example by exposing the coating to a solvent for the organic core and extracting the compound and/or polymer from the coating. A combined treatment of dissolving and degrading/evaporating the organic compounds may also be applied. Based on the specific case, the skilled person will be able to determine suitable conditions.

The invention further relates to an AR coated substrate that is obtainable by or is obtained with the process according to the invention and as described herein above, including all combinations and perturbations of indicated features and embodiments.

An anti-reflective (AR) or light reflection reducing coating is a coating that reduces the reflection of light from the surface of a, preferably transparent, substrate at one or more wavelengths between 425 and 675 nm, as measured at an 5° incident angle. Measurements are carried out on the coated and uncoated substrate. Preferably the reduction in reflection is about 30% or more, preferably about 50% or more, more preferably about 70% or more, even more preferably about 85% or more. The reduction in reflection as expressed in a percentage is equal to 100×(reflection of the uncoated substrate—the reflection of the coated substrate)/(reflection of uncoated substrate).

Typically, the AR coated substrate obtainable by the process according to the invention shows good AR properties, in combination with good mechanical performance, like a surface hardness of at least 3H, more preferably at least 4H or 5H, as measured by the pencil hardness test. The AR coated substrate according to the invention shows at a coated side a minimum reflection of 2% or less at a certain wavelength, preferably of at most about 1.4, 1.2, 1.0, 0.8 or 0.6% (substrate with coating on two sides). The average reflection over a 425-675 nm wavelength range for a two-sided coated substrate is preferably about 3% or less, and more preferably at most about 2, 1.8, 1.7, 1.6 or 1.5%.

The AR coated substrate according to the invention may be used in many different applications and end-uses, like window glazing, cover glass for solar modules, including thermal and photo-voltaic solar systems, or cover glass for TV screens and displays. The invention thus further relates to an article comprising the AR coated substrate obtained with the process according to the invention. Examples of such articles include solar panels, like a thermal solar panel or a photo-voltaic module, monitors, touch-screen displays for e.g. mobile phones, tablet pc's or all-in-one pc's, and TV sets.

As used herein, the term "by mass of the solid fraction" or "mass % based on solids" refers to the mass percentage after removal of all solvent including water and forming of inorganic oxide from the precursor.

Throughout the description and claims of this specification, the words "comprise" and "contain" and variations of the words, for example "comprising" and "comprises", means "including but not limited to", and is not intended to (and does not) exclude other moieties, additives, components, integers or steps.

Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular or preferred aspect, embodiment or example of the invention are to be understood to be applicable to any other aspect, embodiment or example described herein unless stated otherwise or obviously incompatible therewith.

The invention will be further illustrated by the following examples and comparative experiments, without being limited thereto.

EXPERIMENTS

Materials and Methods

Polyampholyte Dispersions

Table 1 presents some characteristics of a number of copolymers in the form of aqueous dispersions, as obtained following the procedure described in the experimental part of EP2178927. These dispersions had a concentration of about 20 mass % of copolymer in water and pH of about 4 (acidified with formic acid), and had undergone heating at about 80° C. during about 30 minutes. PA1-PA4 represent ampholytic terpolymers, PE1 is a cationic copolymer for comparison. The copolymers had a $M_w$ in the range 25-40 kDa.

It is noted that the polyampholytes PA1-PA4 resulted in apparent colloidal aggregates; the polyelectrolyte PE1 appeared to be dissolved, as no distinct particles were detected with DLS.

TABLE 1

|  | PA1 | PA2 | PA3 | PA4 | PE1 |
|---|---|---|---|---|---|
| Monomer composition |  |  |  |  |  |
| DMAEMA (mol %) | 5.3 | 6.4 | 8.1 | 14.0 | 10.9 |
| MAA (mol %) | 1.3 | 1.6 | 2.0 | 3.5 | 0 |
| MMA (mol %) | 93.4 | 92.0 | 89.9 | 82.5 | 89.1 |
| Copolymer dispersion |  |  |  |  |  |
| z-average particle size (nm) | 151 | 41 | 25 | 13 | Not detected |
| PDI | 0.05 | 0.3 | 0.1 | 0.4 |  |

DLS Measurements

A Malvern Nano ZS was used to measure particle size of dispersed particles on 1 drop of dispersion in 10 ml aqueous KCl solution (1 mmol/L) at 25° C. and in back-scattering mode. This apparatus was also used for measuring zeta potential on a diluted sample (with M3 PALS and MPT-2 units).

Pencil Hardness

Hardness of coatings was evaluated with a Gardco 3363 pencil hardness tester on a single-sided coated substrate using a nominal load to the substrate of 300 g, at least 1 day after preparing and curing the coating. The ASTM D3363 test method was followed, ignoring the initial 1 cm for judging damage to the surface.

Optical Properties

Reflection and transmission of coated transparent substrates were evaluated with a Shimadzu UV-2450 spectrophotometer. Relative specular reflectance was measured at an incident angle of 5° with a reflectance attachment. For measuring transmission the integrating sphere attachment was installed in the sample compartment, and incidence angle was 0°. Average reflection values are calculated for the wavelength range 425-675 nm. Measurements are performed on two-sided coated substrate unless indicated otherwise.

EXAMPLE 1

Aqueous dispersion of PA3 was acidified to about pH 2.5 with 10% HCl, heated to above 60° C., cooled to room temperature, and then diluted and placed in the DLS device; allowing to measure particle size, pH and zeta-potential simultaneously. The pH of the dispersion was gradually increased by addition of aliquots of aqueous ammonia. Particle size was found to remain about 25 nm until about pH 6.5, after which particle size quickly increased. The zeta-potential dropped from about 35 to −5 mV in this range, indicating that net charge changed from positive to negative.

In other experiments pH of more concentrated dispersions was gradually increased at room temperature, which resulted in gel formation at about pH 6.5.

EXAMPLE 2

Example 1 was repeated without the dilution step needed for DLS, and the dispersion was heated to about 90° C. after each addition of aqueous ammonia. Particle size and pH were measured before and after heating. Results presented in Figure 1 show that average particle size of this polyampholyte colloidal dispersion can be adjusted by changing both pH and temperature in the range 20-50 nm. Note that the sample brought to pH 6.5 gelled upon heating.

EXAMPLE 3

Figure 2:
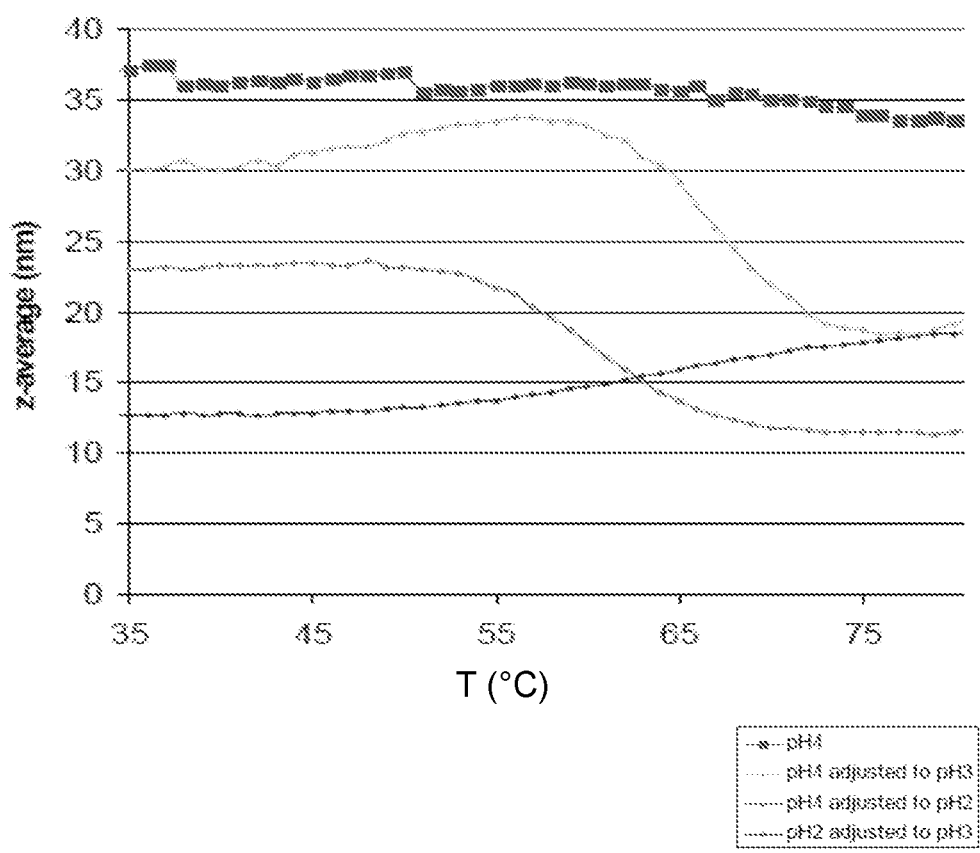
FIG. 2 is a graph of the z-average particle size (nm) of the polyampholyte colloidal dispersion versus temperature (° C.) according the results obtained in Example 3 hereinbelow.

A sample of PA3 dispersion with pH 4 was diluted and placed in the DLS device; and particle size was measured as function of temperature. The graph shown in Figure 2 indicates that the dispersion is stable up to about at least 80° C. The experiment was repeated after adjusting pH to about 3, in which case particle size decreased when temperature raised to above about 60° C. Similarly, particle size decreased upon heating after adjusting pH to about 2.

If this sample was subsequently cooled and pH adjusted to 3, followed by reheating, particle size increased again.

These experiments again show that particle size of the polyampholyte colloidal dispersion can be adjusted by changing both pH and temperature.

EXAMPLE 4

In these experiments different amounts of silica precursor were added to PA3 dispersion, and the colloidal dispersion obtained was then used to make coating compositions, and subsequently to make coated glass substrates.

425 g of PA3 dispersion (about 20% solids in water of pH 4) was diluted with 3835 g of water in a conical 5 L flask equipped with an 8 cm magnetic stirring bar. After dilution the DLS z-average particle size was 25.6 nm, zeta-potential +25 mV, and pH 4.1. 300 g TMOS was then added in about 5 min. under stirring at temperature within 21-25° C. After 24 hr stirring, particle size was measured to be 28.5 nm, zeta-potential +12 mV, and pH 3.8. From these changes formation of a Si-containing shell on the polyampholyte particles resulting in core-shell particles can be concluded. The calculated mass ratio of $SiO_2$ (resulting from TMOS) to polyampholyte is 1.39.

A sol of TEOS in ethanol/water was prepared by adding 339 g TEOS to 922 g ethanol in a conical 5 L flask with an 8 cm stirring bar. Subsequently 310 g water and then 34.6 g of glacial acetic acid were added, and stirred during 24 hr at ambient conditions. Then 965 g ethanol was added and 7.2 g of nitric acid (65%).

To the core-shell particles dispersion 1124 g of the TEOS sol was added as binder, after which the pH was adjusted to about 2 by adding nitric acid (65%), followed by adding 5600 g of ethanol; and refluxing during 1 hr. The calculated mass ratio of $SiO_2$ (resulting from TMOS and TEOS) to polyampholyte is is 1.89 for this coating composition.

The obtained coating composition was used to provide coating layers to glass plates by a dip-coating process. A float glass plate of 50×50 cm and 2 mm thickness was dip-coated by immersing in a container containing this composition. The coating bath was kept at ambient conditions, i.e. at about 21° C. and 50% relative humidity. The plate was then vertically pulled up from the bath at a rate of about 6.0 mm/s. The coated plate was subsequently dried at ambient conditions for about 5 minutes, and then cured at 450° C. in an air circulation oven during 3 hours.

The coated glass thus obtained appeared completely clear to the eye, and showed no visual defects. Reflection properties of coated glass plates were measured; results are summarized in Table 2.

The hardness of the cured coating was measured on a single-side dip-coated glass plate as pencil hardness 5H.

Both the intermediate core-shell particles dispersion and the coating composition were found to be stable. The coating composition appeared virtually clear to the eye, and did not visually change upon storage during at least 7 months under ambient conditions. Repeating the coating experiments during said storage period resulted in similar coating performance. Also after 18 months of storage the composition was haze free, and could be made into a coating with similar properties.

TABLE 2

| Sample | "SiO$_2$"/polyampholyte (m/m) | Minimum reflection (%) | Wavelength of minimum reflection (nm) | Average reflection (%) |
|---|---|---|---|---|
| Example 4 | 1.89 | 0.9 | 545 | 1.4 |
| Example 5 | 1.5 | 0.3 | 543 | 0.8 |
| Example 6 | 1.75 | 0.5 | 546 | 1.0 |
| Example 7 | 2.0 | 0.9 | 581 | 1.5 |
| Example 8 | 2.25 | 1.2 | 581 | 1.8 |
| Example 9 | 2.5 | 1.4 | 579 | 2.0 |

EXAMPLES 5-9

Example 4 was repeated, but a different amount of TMOS was used and the amount of TEOS sol added was varied from no addition (Ex 5) to such amount resulting in a calculated SiO2 to polyampholyte ratio of 2.5. Compositional data and measured reflection properties are summarized in Table 2. It can be concluded that increasing the amount of TEOS results in somewhat more reflection (or reduces somewhat the AR properties). This can be explained by TEOS acting as binder for dispersed particles resulting in lower porosity, which expectedly increases mechanical properties.

EXAMPLE 10

Analogous to Example 4a colloidal core-shell PA3/TMOS dispersion was made, and then acidified to pH 2.5 with nitric acid, and heated to about 80° C. under reduced pressure, during which evaporation of water was observed. The initial solids content of this dispersion of about 4 mass % was now measured to be about 13.5 mass % (and was still clear).

To make a coating composition, this dispersion was again diluted with ethanol to about 3 mass % solids, and then TEOS sol (as made above) was added to result in a "SiO$_2$"/polyampholyte ratio of 1.6. A dip-coated glass plate showed good optical properties without defects and minimum reflection of 0.4% at 628 nm.

EXAMPLE 11

A polyampholyte containing MMA, DMAEMA and MAA monomeric units was prepared by emulsion polymerisation of MMA and DMAEMA (85:15 mol ratio) at 85° C. during 60 min. in the presence of ammonium persulphate as initiator, iso-octyl thioglycolate as chain transfer agent, and a phosphate-based anionic surfactant (Rhodafac RS-710). To improve stability of the dispersion so obtained a non-ionic surfactant was added. After cooling to room temperature, formic acid solution was added during 30 min to result in pH of 4. The resulting polyampholyte dispersion had a solids content of 20 mass %, particle size was about 78 nm (z-average particle size; PDI 0.1), and Mw 40 kDa (GPC).

As it is known that DMAEMA may hydrolyse to form acid groups (MAA), the charge density of the dispersion was measured using a Mutek PCD 03 pH. particle charge detector. About 100 mg sample was diluted with water to 30 ml, and 1000 µl 0.1 M acetic acid buffered at pH 4 was added. The sample was titrated until zero charge potential (in mV) with 0.001 N solution of sodium poly-ethylenesulfonate (NaPES). The measured charge density was about 20% lower than the calculated charge density for a MMA/DMAEMA 85/15 copolymer. Apparently about 20% of DMAEMA had hydrolysed into MAA units; which was confirmed by isoelectric point determination.

Figure 3:
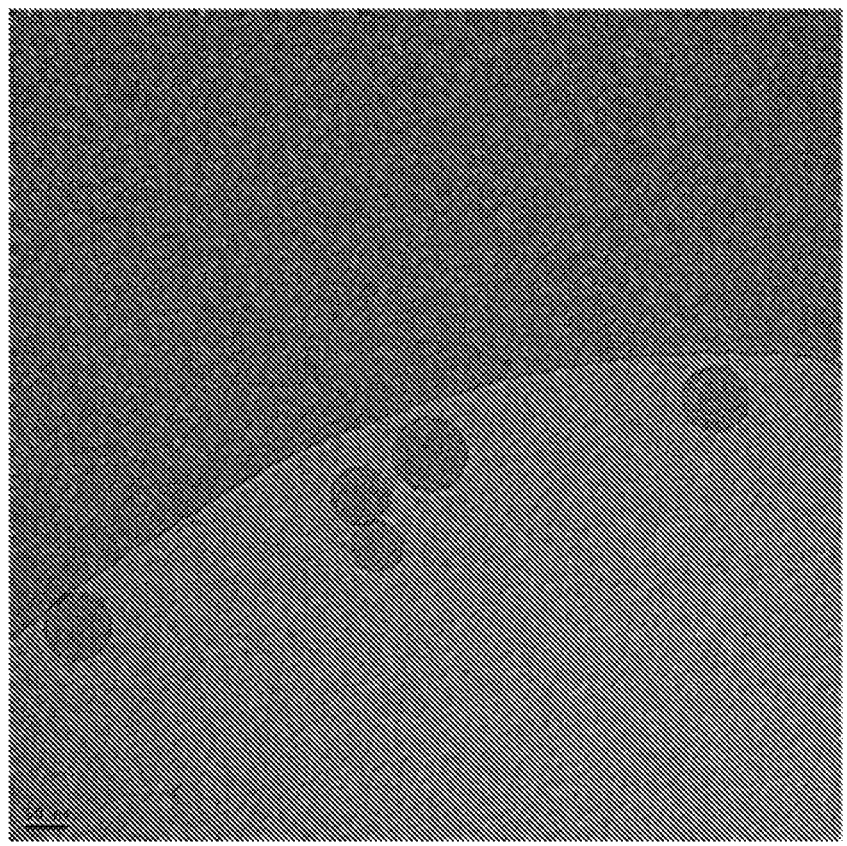
FIG. 3 is cryo-TEM micrograph of the composition obtained according to Example 11 hereinbelow showing spherical particles with core-shell structure and a diameter of about 60-90 nm.

A coating composition was then prepared by diluting the polyampholyte dispersion with water to a solids content of 10 mass %, followed by adding TMOS under stirring at about 15° C.; at a mass ratio of TMOS/dispersed polyampholyte of 5. After 16 hr DLS measurements indicated a particle size of 120 nm; then the formulation was acidified with diluted nitric acid to pH 1.5, followed by diluting with isopropanol to result in a composition with about 2 mass % theoretical SiO$_2$ content. The obtained composition was colourless and haze-free, and was stored during several months at room temperature (or several weeks at 40° C.). Weekly visual inspection and DLS measurements did not reveal measurable changes. A sample from the composition was examined with cryo-TEM; the micrograph shown in Fig. 3 shows spherical particles with core-shell structure and of diameter of about 60-90 nm.

Analogously to Example 4 glass plates were dip-coated and cured at 650° C. during 2.5 min. The resulting coated plates were transparent without haze, and showed no visual defects. Minimum reflection was 0.7% at 575 nm. The optical properties appeared to be insensitive to changes in relative humidity during storage under ambient conditions.

The invention claimed is:
1. A method of making hybrid organic-inorganic core-shell nano-particles, comprising the steps of:
   a) providing colloidal organic particles as a template;
   b) adding at least one inorganic oxide precursor; and
   c) forming an inorganic shell layer from the precursor on the template to result in core-shell nano-particles; wherein
   the colloidal particles are comprised of an organic synthetic polyampholyte having an average particle size of 5-500 nm as measured by Dynamic Light Scattering (DLS), and wherein
   the organic synthetic polyampholyte is a copolymer of at least one comonomer having a positively charged group and at least one comonomer having a negatively charged group such that the copolymer has opposite charges on different pending groups.

2. The method according to claim 1, wherein the method further comprises the step of forming the polyampholyte from vinyl monomers by addition copolymerization.

3. The method according to claim 1, wherein the polyampholyte is a copolymerization reaction product of monomers comprising:
   (i) at least one cationic or basic monomer (M1) selected from the group consisting of compounds with a pending group that can combine with a proton;
   (ii) at least one anionic or acidic monomer (M2) selected from the group consisting of compounds with a pending group that can yield a proton;
   (iii) at least one neutral or non-ionic monomer (M3); and
   (iv) optionally at least one cross-linking monomer (M4).

4. The method according to claim 3, wherein the polyampholyte is a copolymerization reaction product of monomers comprising:
   (i) 5-40 mole % of at least one monomer M1;
   (ii) 0.5-20 mole % of at least one monomer M2;
   (iii) 38-94.5 mole % of at least one monomer M3; and
   (iv) 0-2 mole % of at least one monomer M4.

5. The method according to claim 3, wherein the polyampholyte is a copolymerization reaction product of monomers comprising:
   (i) 8-20 mole % of at least one monomer M1 selected from the group consisting of amino-functional (meth)acrylates and (meth)acrylamides;
   (ii) 1-4 mole % of at least one monomer M2 selected from the group of (meth)acrylic monomers with a carboxylic acid group; and
   (iii) 76-91 mole % of at least one monomer M3 selected from the group of C1-C18 alkyl (meth)acrylates.

6. The method according to claim 3, wherein the at least one cationic or basic monomer (M1) comprises a compound having pending tertiary amine group that can combine with a proton.

7. The method according to claim 1, wherein the colloidal organic particles are provided by dispersing the synthetic polyampholyte in an aqueous medium, and by adjusting particle size by changing both pH and temperature.

8. The method according to claim 1, wherein the colloidal organic particles have average particle size of 20-200 nm as measured by DLS.

9. The method according to claim 1, wherein the colloidal organic particles consist of synthetic polyampholyte, water, and organic solvent.

10. The method according to claim 1, wherein the inorganic oxide precursor is at least one compound selected from the group consisting of metal salts, metal chelates and organo-metallic compounds of Si, Al, Ti, and Zr.

11. The method according to claim 10, wherein the inorganic oxide precursor comprises an alkoxy silane.

12. The method according to claim 1, wherein the polyampholyte is a copolymerization reaction product of monomers comprising:
   (a) at least one cationic or basic monomer (M1) comprising a tertiary amine group;
   (b) at least one anionic or acidic monomer (M2) comprising a carboxylic acid group;
   (c) at least one neutral or non-ionic monomer (M3); and
   (d) optionally at least one cross-linking monomer (M4).

* * * * *